United States Patent
Zhu et al.

(10) Patent No.: US 7,990,717 B2
(45) Date of Patent: Aug. 2, 2011

(54) HEAT SINK AND ELECTRONIC DEVICE USING SAME

(75) Inventors: Xi-Jian Zhu, Shenzhen (CN); Ran Lin, Shenzhen (CN)

(73) Assignees: Furui Precise Component (Kunshan) Co., Ltd., Kunshan, Jiangsu Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 43 days.

(21) Appl. No.: 12/504,679

(22) Filed: Jul. 17, 2009

(65) Prior Publication Data

US 2010/0157541 A1  Jun. 24, 2010

(30) Foreign Application Priority Data

Dec. 23, 2008  (CN) .......................... 2008 1 0306478

(51) Int. Cl.
*H05K 7/20* (2006.01)

(52) U.S. Cl. .......... 361/710; 361/704; 361/709; 257/99; 165/80.3; 165/185; 428/195.1; 428/408

(58) Field of Classification Search .................. 361/704, 361/707, 709, 710, 717, 719
See application file for complete search history.

(56) References Cited

U.S. PATENT DOCUMENTS

| | | | | |
|---|---|---|---|---|
| 4,234,638 A * | 11/1980 | Yamazoe et al. | ............. | 428/133 |
| 5,660,917 A * | 8/1997 | Fujimori et al. | ........... | 428/195.1 |
| 6,411,513 B1 * | 6/2002 | Bedard | .......................... | 361/704 |
| 6,555,223 B2 * | 4/2003 | Kubo | ............................. | 428/408 |
| 6,615,909 B2 * | 9/2003 | Fast | ............................... | 165/80.3 |
| 6,886,249 B2 * | 5/2005 | Smalc | ......................... | 29/890.03 |
| 7,147,041 B2 * | 12/2006 | Mitchell et al. | ............. | 165/80.3 |
| 2003/0056943 A1 * | 3/2003 | Dessiatoun et al. | ......... | 165/142 |
| 2006/0279936 A1 * | 12/2006 | Karidis et al. | ................ | 361/710 |
| 2007/0133177 A1 * | 6/2007 | Loebach et al. | ............. | 361/704 |

* cited by examiner

*Primary Examiner* — Boris L. Chervinsky
*Assistant Examiner* — Courtney Smith
(74) *Attorney, Agent, or Firm* — Frank R. Niranjan

(57) ABSTRACT

An electronic device includes a shell, an electronic component received in the shell, and a heat sink arranged between the electronic component and the shell. The heat sink includes a first heat spreader attaching to the electronic component, a second heat spreader spaced from the first heat spreader, and a plurality of fins between the first and second heat spreaders. Each fin includes a pair of contacting portions, a pair of bending portions and a connecting portion each of which being flat. The contacting portions are respectively connected to the two heat spreaders. The bending portions respectively extend from the contacting portions towards each other. Each bending portion forms a rear end adjacent to the other bending portion. The connecting portion interconnects the rear ends of the bending portions at opposite ends thereof.

17 Claims, 9 Drawing Sheets

HEAT SINK AND ELECTRONIC DEVICE USING SAME

BACKGROUND

1. Technical Field

The disclosure generally relates to heat sinks, and particularly to a heat sink having a good adaptability to different electronic devices and an electronic device incorporating the heat sink.

2. Description of Related Art

With continuing development of the electronic technology, electronic components such as CPUs (central processing units) generate more and more heat required to be dissipated immediately. Conventionally, heat sinks are used to remove the heat generated by the electronic components.

A typical heat sink includes a base and a plurality of heat dissipation fins extending upwardly from the base. The heat dissipation fins are flat-shaped and rigid. A size of the heat sink can not be changed in use unless be destroyed. However, different electronic devices usually have different shapes and sizes, and thus spaces of the electronic devices for accommodating the heat sink are different from each other. Therefore, the heat sink with a changeless size can only be used in one special electronic device, which causes an inferior adaptability of the heat sink.

For the said reasons, therefore, there is a need in the art for a heat sink which overcomes the limitations described.

DETAILED DESCRIPTION

Figure 1:
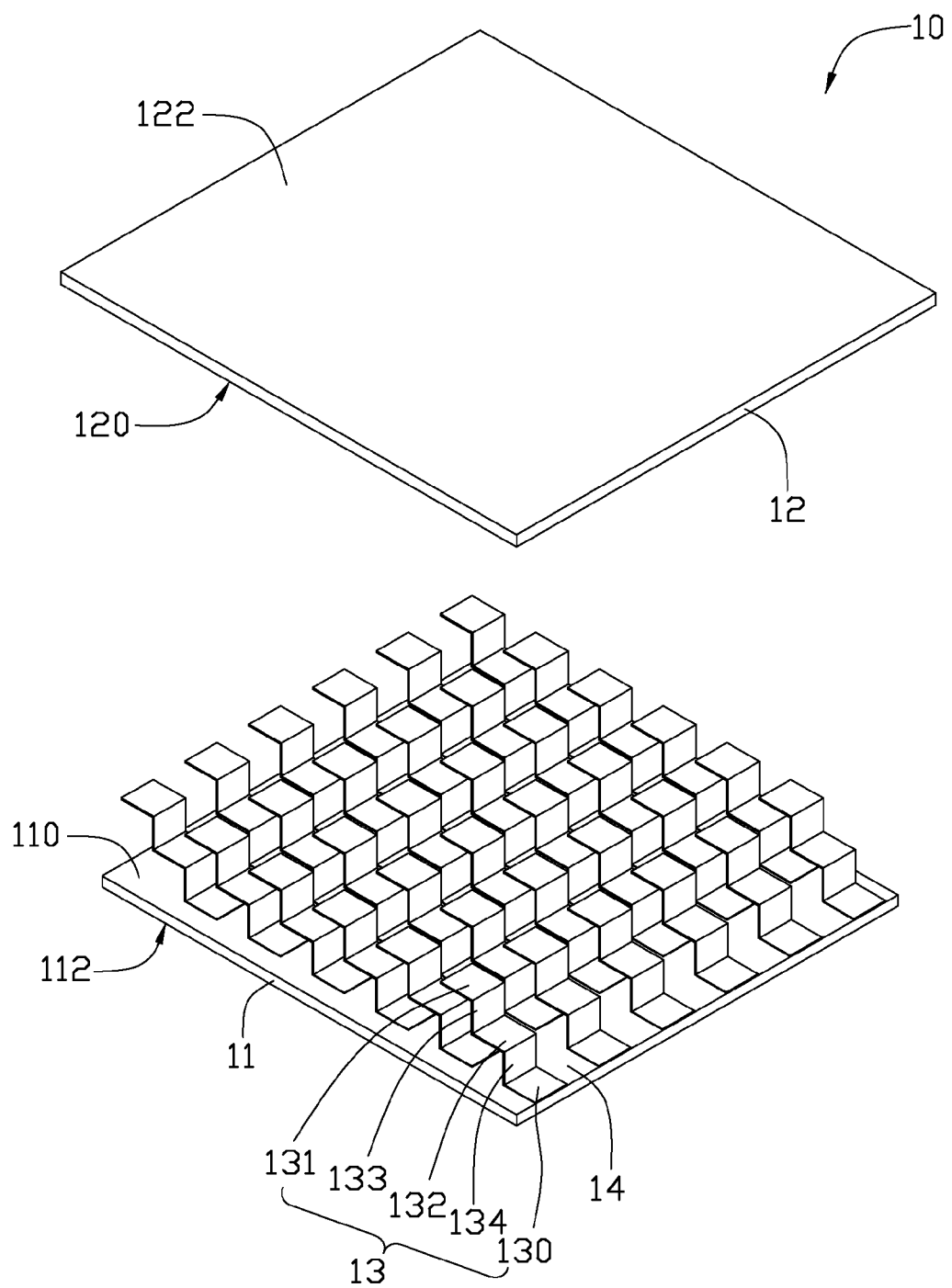
FIG. 1 is an isometric, exploded view of a heat sink according to a first embodiment.

Referring to FIG. 1, a heat sink 10 according to a first embodiment includes a first heat spreader 11, a second heat spreader 12, and a plurality of fins 13.

The first heat spreader 11 and the second heat spreader 12 are substantially identical to each other. Both of the first and the second heat spreaders 11, 12 are made of thermal conductive materials, such as copper, aluminum, or their alloy. The first heat spreader 11 and the second heat spreader 12 are parallel to and spaced from each other. Each of the first and the second heat spreaders 11, 12 is substantially a rectangular plate, and includes a planar inner surface 110, 120 and a planar outer surface 112, 122 opposite to the inner surface 110, 120. The inner surfaces 110, 120 of the first heat spreader 11 and the second heat spreader 12 face each other.

The fins 13 are arranged between the first heat spreader 11 and the second heat spreader 12. In this embodiment, the fins 13 are arranged in six lines by seven rows. Each fin 13 spaces a narrow distance 14 from the other fins 13. The fins 13 are made of thermal conductive and flexible materials, such as aluminum or aluminum alloy. Each fin 13 is step-shaped, and is formed by folding a sheet firstly downward and then rightward successively for two times.

Each fin 13 includes an upper contacting portion 131, a lower contacting portion 130, an upper bending portion 133 extending downwardly from a right end of the upper contacting portion 131, a lower bending portion 134 extending upwardly from a left end of the lower contacting portion 130, and a connecting portion 132 with a left end connected to a bottom end of the upper bending portion 133 and a right end connected to a top end of the lower bending portion 134. Each of the upper and lower bending portions 133, 134, the upper and lower contacting portions 130, 131 and the connecting portion 132 is substantially square. The upper and lower contacting portions 130, 131 and the connecting portion 132 are horizontal and parallel to the heat spreaders 11, 12. The upper and lower bending portions 133, 134 are parallel to each other, and perpendicular to the heat spreaders 11, 12. Therefore, the contacting portions 131, 130 and the connecting portion 132 of each fin 13 are spaced from each other in a vertical direction, and are continues in a horizontal direction. The bending portions 133, 134 of each fin 13 are spaced from each other in the horizontal direction, and are continues in the vertical direction.

When the heat sink 10 is assembled, the upper contacting portion 131 of each fin 13 is firmly connected to the inner surface 120 of the second heat spreader 12, and the lower contacting portion 130 of each fin 13 is firmly connected to the inner surface 110 of the first heat spreader 11. Preferably, the contacting portions 131, 130 of each fin 13 are firmly connected to the inner surfaces 110, 120 of the heat spreaders 11, 12 by welding. Since the fins 13 are made of flexible material, the fins 13 can deform elastically to change a height of the fins 13 when the heat spreaders 11, 12 are subjected to an external compressing force. Thus a height of the heat sink 10 is changed as the height of the fins 13 changes.

Figure 2:
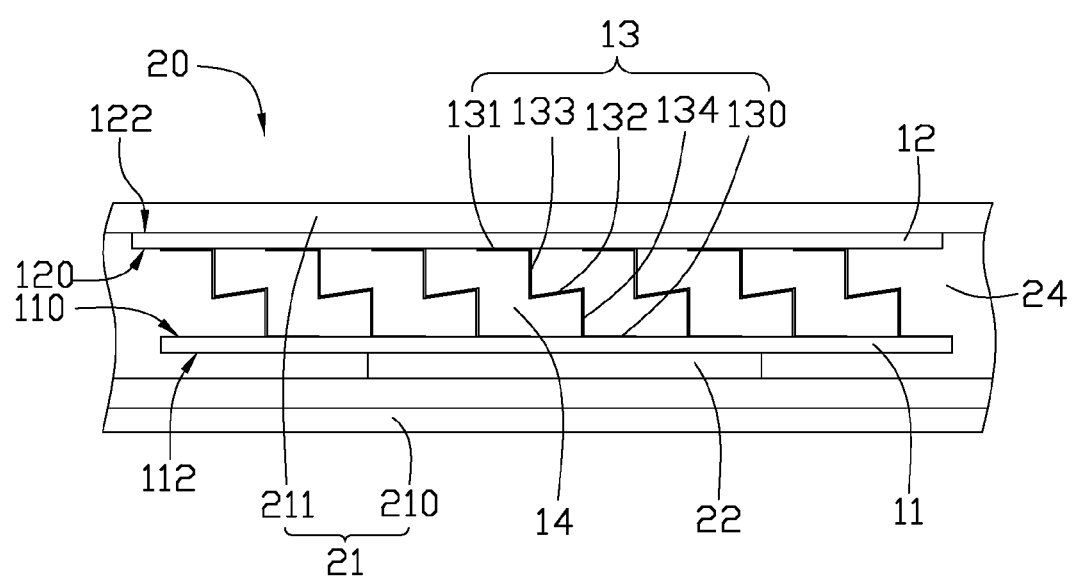
FIG. 2 is a schematic view showing the heat sink of FIG. 1 being compressed and assembled into an electronic device with a small size.

FIG. 2 shows the heat sink 10 mounted into an electronic device 20. In general, the electronic device 20 has an electronic component 22 which generates heat that needs an effective dissipation by the heat sink 10 to ensure that the electronic device 20 can work normally. The electronic device 20 may be a computer, a projector, etc. The electronic component 22 can be a CPU, a north bridge, a power chip, etc. The electronic device 20 includes a shell 21 receiving the electronic component 22 therein. The shell 21 includes a top plate 211, a bottom plate 210 parallel to the top plate 211, and a side plate (not shown) between the top plate 211 and the bottom plate 210. In this embodiment, a space 24 of the shell 21 for accommodating the heat sink 10, i.e., a space 24 between the electronic component 22 and the top plate 211, is narrow, with a height being a little smaller than that of the heat sink 10 at free.

When assembled, an external force is applied on the heat spreaders 11, 12 to compress the heat sink 10 along the vertical direction, i.e., the direction perpendicular to the heat spreaders 11, 12, to reduce the height of the heat sink 10. In this situation, the heat dissipation fins 13 deform resiliently. The connecting portion 132 of each fin 13 becomes aslant, and the bending portions 133, 134 of each fin 13 overlap partly in the vertical direction. Thus the heat sink 10 can be assembled between the electronic component 22 and the top plate 211 of the shell 21 with the first heat spreader 11 tightly attaching to the electronic component 22 and the second heat spreader 12 abutting against the top plate 211 of the shell 21. Preferably, a layer of thermal interface material (TIM) can be applied on the outer surfaces 112, 122 of the heat spreaders 11, 12 to eliminate air interstices between the first heat spreader 11 and the electronic component 22 and between the second heat spreader 12 and the top plate 211 of the shell 21.

During operation of the electronic component 22, the first heat spreader 11 absorbs heat from the electronic component 22. Then the heat is spread onto the fins 13 which have a large heat exchange area for dissipation. Since the second heat spreader 12 attaches to the top plate 211 of the shell 21, part of the heat of the electronic component 22 can be conducted to the shell 21 through the second heat spreader 12. Thus part of the heat can be dissipated to ambient air directly through the shell 21, which enables the shell 21 of the electronic device 20 to function as an assistant component for heat dissipation. Moreover, the deformable heat sink 10 abutting the shell 21 acts as a buffer to reduce an impact on the electronic component 22 when the electronic device 20 suffers an external force, thus to protect the electronic component 22 from damage.

Figure 3:
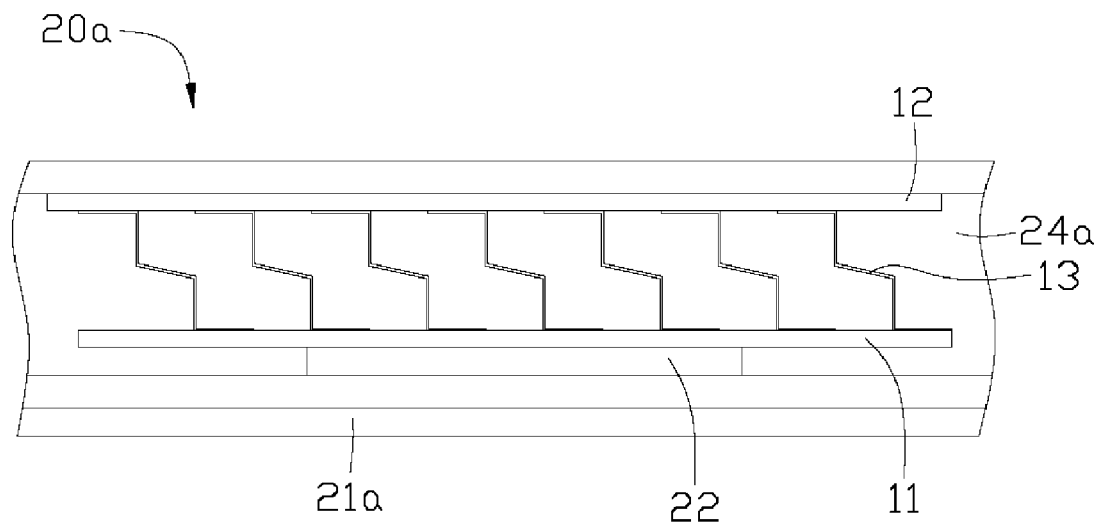
FIG. 3 is similar to FIG. 2, but shows the heat sink being stretched and assembled into an electronic device with a large size.
Figure 4:
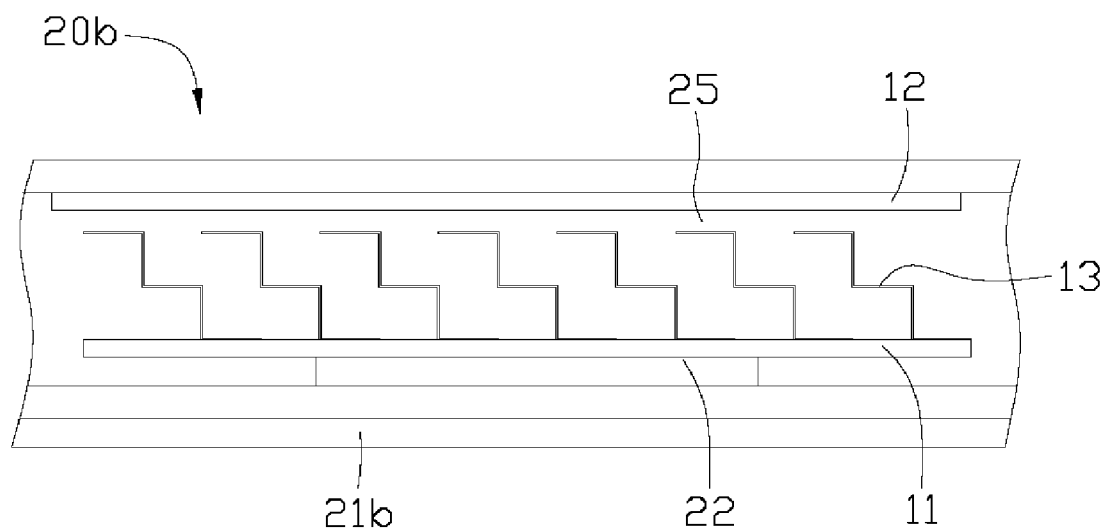
FIG. 4 shows the heat sink of FIG. 1 being assembled into an electronic device having a large size without deformation.

Conversely, as shown in FIG. 3, when the heat sink 10 is assembled into an electronic device 20a which has a shell 21a defining a space 24a larger than the heat sink 10, the heat sink 10 is stretched along the direction perpendicular to the heat spreaders 11, 12 to increase the height of the heat sink 10, and thus let the second heat spreader 12 to abut the shell 21 a for enhancing heat dissipation efficiency of the heat sink 10. In this state, the connecting portion 132 of each fin 13 becomes aslant, and the bending portions 133, 134 of each fin 13 spaced from each other in the vertical direction. Understandably, as shown in FIG. 4, the heat sink 10 can be assembled into an electronic 20b with a shell 21b defining a space larger than the heat sink 10 without deformation. In this situation, the second heat spreader 12 is spaced a narrow channel 25 from the shell 21b. Therefore, the heat sink 10 can be mounted into electronic devices with different inner spaces, and an adaptability of the heat sink 10 is thus enhanced.

Figure 5:
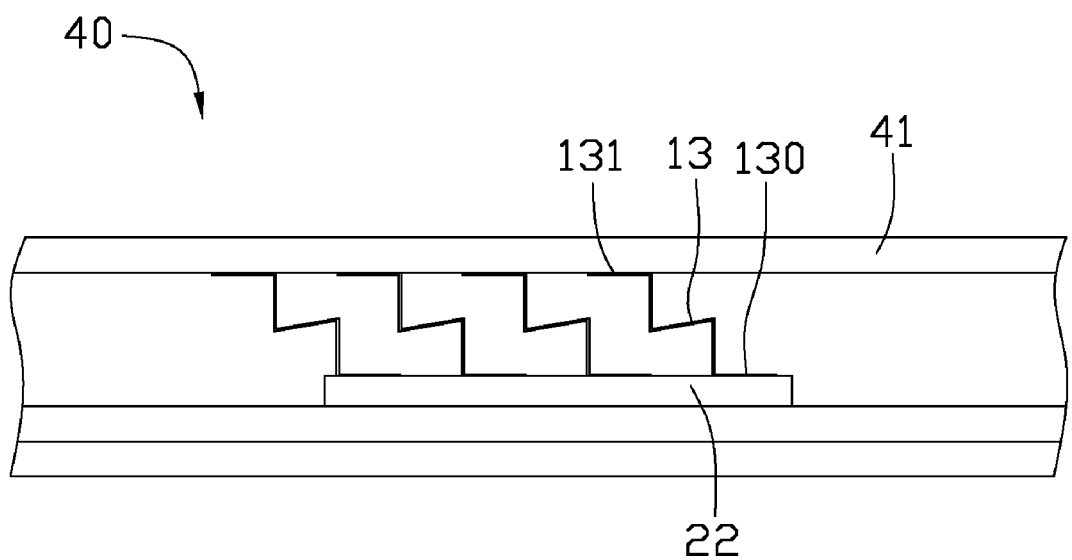
FIG. 5 is similar to FIG. 2, but shows a plurality of fins of the heat sink being directly assembled into an electronic device.

In addition, the fins 13 can be directly arranged on the electronic component 22 to cool the electronic component 22. In other words, the heat spreaders 11, 12 can be omitted. FIG. 5 shows several fins 13 mounted into an electronic device 40 with the lower contacting portion 130 of each fin 13 attaching to the electronic component 22 and the upper contacting portion 131 of each fin 13 attaching to a shell 41 of the electronic device 40 to conduct the heat of the electronic component 22 to the shell 41 for dissipation. An amount of the fins 13 arranged on the electronic component 22 is decided according to a size of the electronic component 22 and a size of the fin 13. Alternatively, the fins 13 can be directly assembled to an electronic device of a large size with deformation or without deformation.

Figure 6:
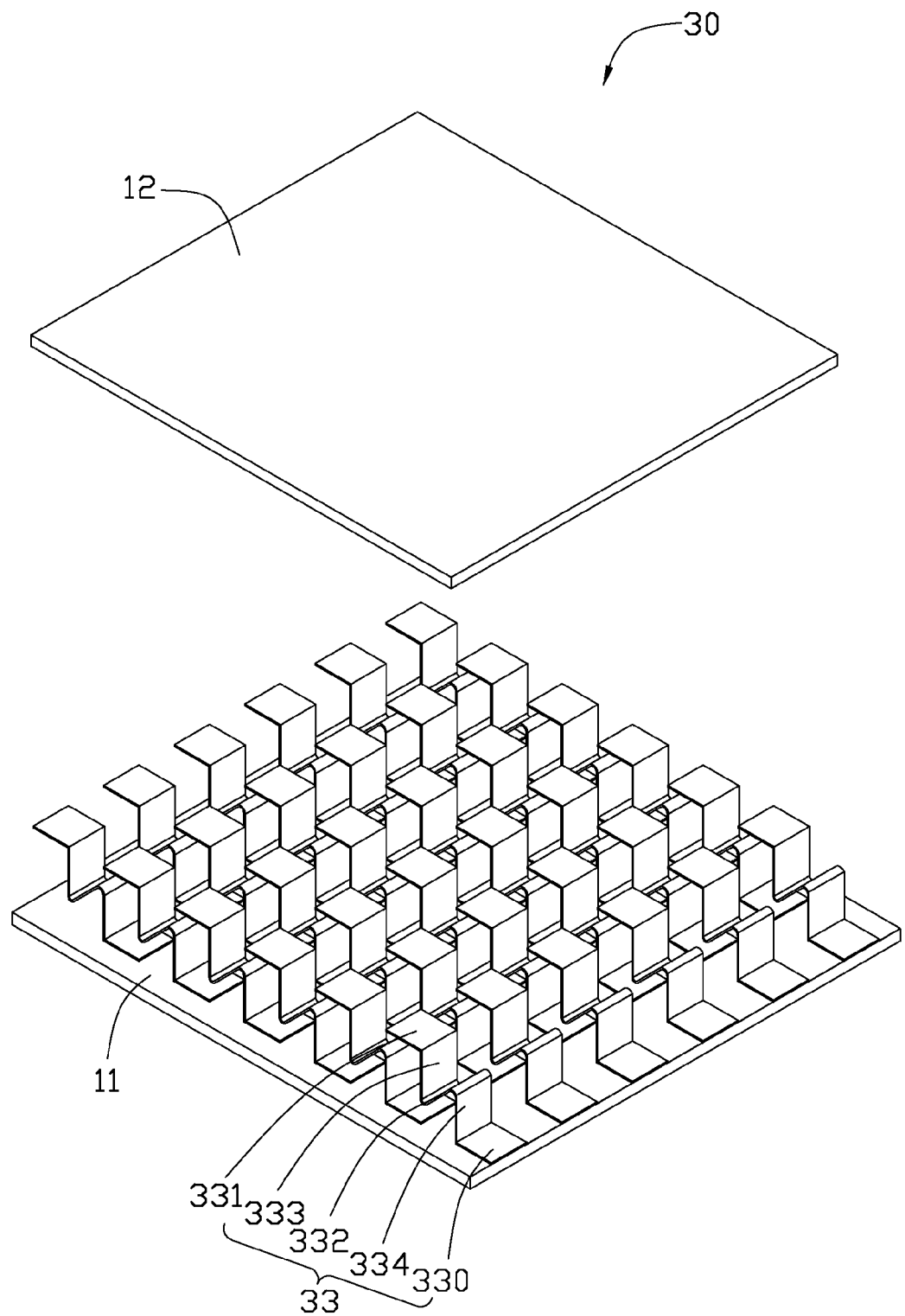
FIG. 6 is an isometric, exploded view of a heat sink according to an alternative embodiment.
Figure 7:
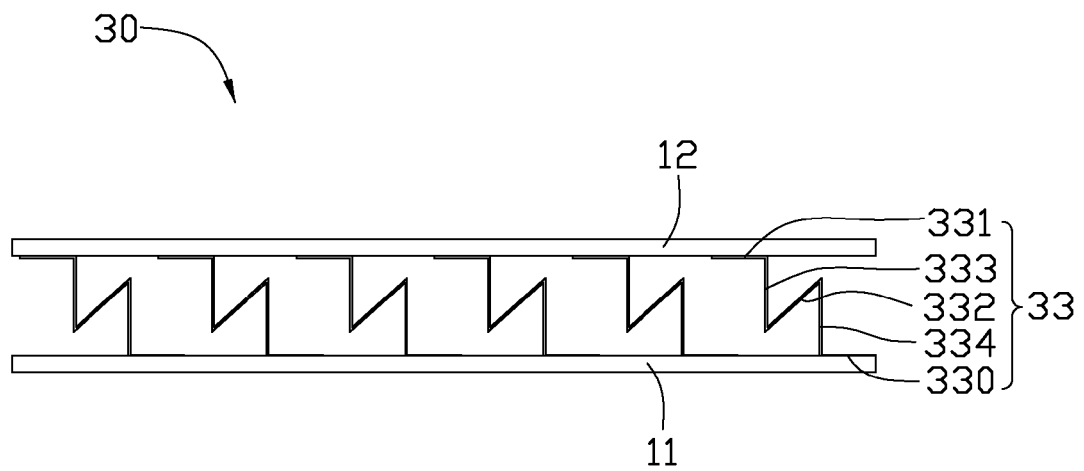
FIG. 7 is a side view of the heat sink of FIG. 6.

Referring to FIGS. 6-7, a heat sink 30 according to a second embodiment is shown. The difference of the heat sink 30 from the previous heat sink 10 is the fins 33. Each fin 33 includes upper and lower contacting portions 331, 330 attaching to the heat spreaders 12, 11 respectively, upper and lower bending portions 333, 334 extending from the upper and lower contacting portions 331, 330 towards each other, and a connecting portion 332 between the upper and lower bending portions 333, 334. In this embodiment, the upper and the lower bending portions 333, 334 of each fin 33 overlap partly in the vertical direction when the heat sink 30 is at free. In other words, a bottom end of the upper bending portion 333 is lower than a top end of the lower bending portion 334 when the heat sink 30 is at free. The connecting portion 332 of each fin 33 connected to the bottom end of upper bending portion 333 and the top end of the lower bending portion 334 slants from lower left to upper right when the heat sink 30 is at free. Similarly, external force can be applied to the heat spreaders 11, 12 to compress or stretch the heat sink 30, and thus the heat sink 30 can be used in different electronic devices of different sizes.

Figure 8:
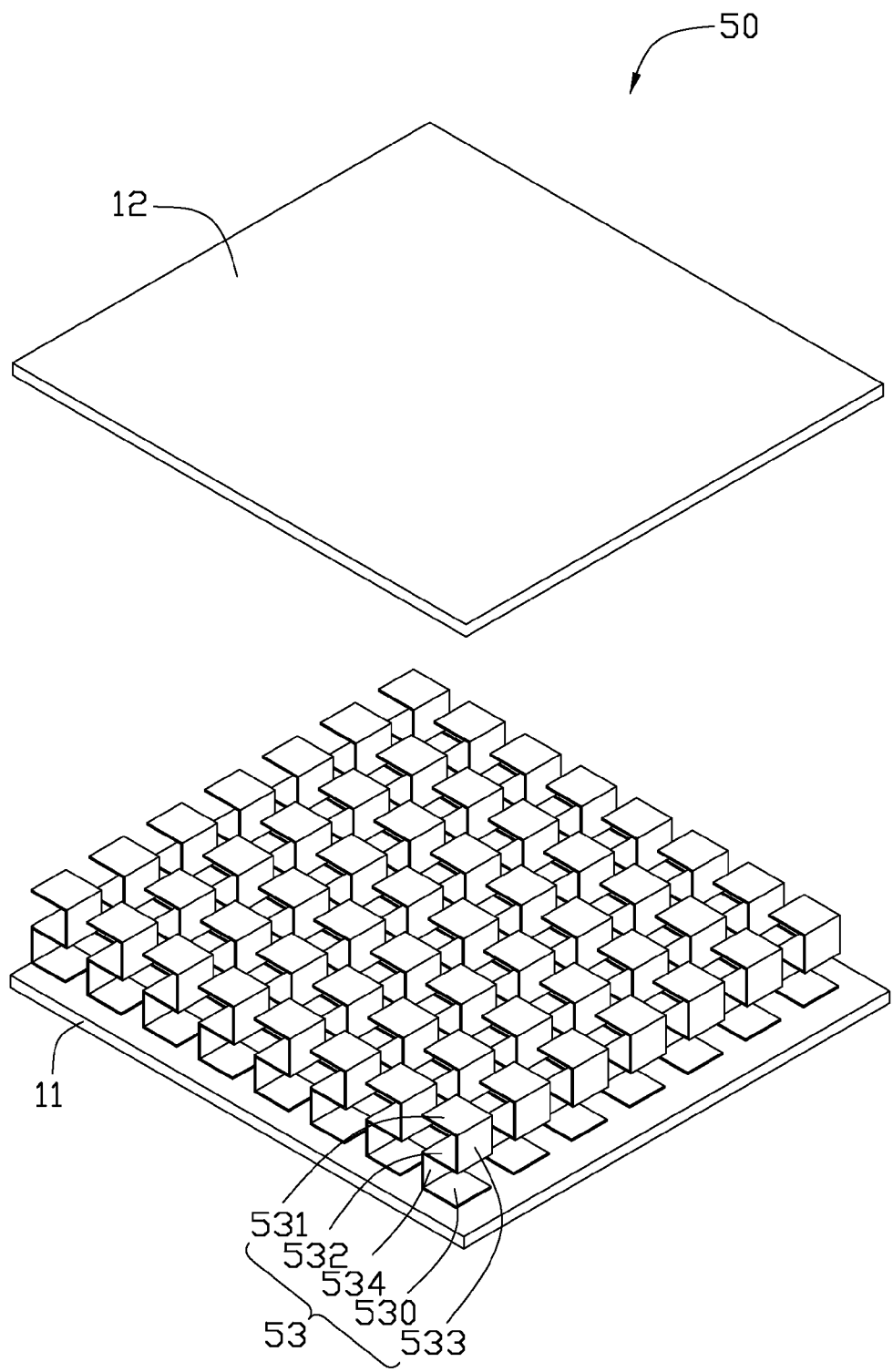
FIG. 8 is an isometric, exploded view of a heat sink according to a third embodiment.
Figure 9:
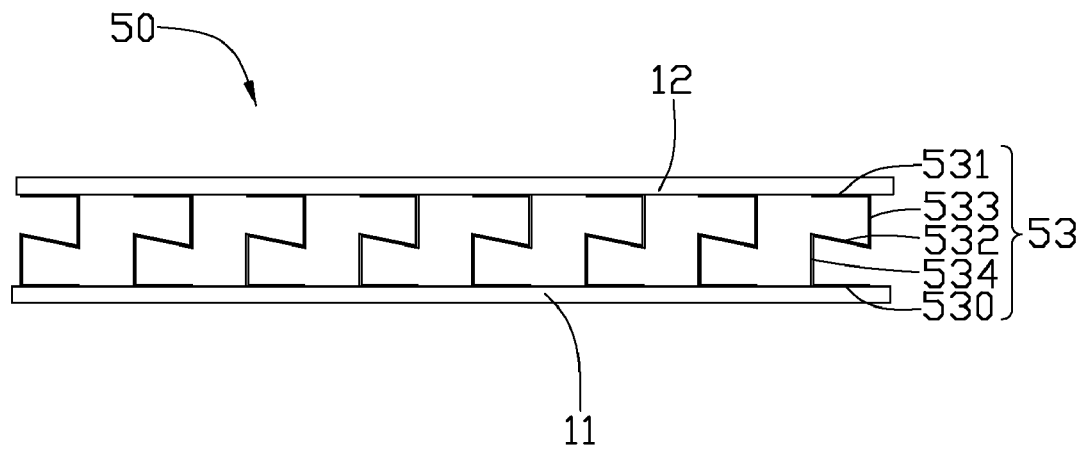
FIG. 9 is a side view of the heat sink of FIG. 8.

FIGS. 8-9 show a heat sink 50 according to a third embodiment. The heat sink 50 includes a plurality of fins 53 arranged between the first heat spreader 11 and the second heat spreader 12. Each fin 53 includes an upper contacting portion 531, a lower contacting portion 530, an upper bending portion 533, a lower bending portion 534, and a connecting portion 532. The upper contacting portion 531, the lower contacting portion 530, and the connecting portion 532 are parallel to each other, and are overlap entirely in the horizontal direction. The upper bending portion 533 interconnects right ends of the upper contacting portion 531 and the connecting portion 532. The lower bending portion 534 interconnects left ends of the lower contacting portion 530 and the connecting portion 532. Accordingly, the heat sink 50 can accommodate its height through deformation to a space of an electronic device.

It is to be understood that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device, comprising:
    a shell;
    an electronic component received in the shell; and
    a heat sink arranged between the electronic component and the shell, the heat sink comprising a first heat spreader attaching to the electronic component, a second heat spreader spaced from the first heat spreader, and a plurality of fins between the first and the second heat spreaders, each of the fins comprising a pair of contacting portions, a pair of bending portions and a connecting portion each of which is flat, the contacting portions respectively connected to the first and second heat spreaders, the bending portions respectively extending from the contacting portions towards each other, each bending portion forming a rear end adjacent to the other bending portion, the connecting portion interconnecting the rear ends of the bending portions at opposite ends thereof;
    wherein the contacting portions are parallel to each other, each bending portion extends substantially perpendicularly from one corresponding contacting portion, and the connecting portion is aslant to the contacting portions and the bending portions.

2. The electronic device of claim 1, wherein the bending portions of each fin overlap partly in a direction perpendicular to the contacting portions, and the contacting portions and the connecting portion of each fin are continuous in a direction parallel to the contacting portions.

3. The electronic device of claim 1, wherein the second heat spreader attaches to the shell for conducting heat of the electronic component to the shell.

4. An electronic device, comprising:
    a shell;
    an electronic component received in the shell; and
    a fin arranged between the shell and the electronic component, the fin comprising a pair of contacting portions, a pair of bending portions and a connecting portion each of which is flat, one of the contacting portions attaching to the electronic component, the other one of the contacting portions being spaced from the electronic component, the bending portions respectively extending from the contacting portions towards each other, each bending portion forming a rear end away from a corresponding contacting portion, the connecting portion interconnecting the rear ends of the bending portions at opposite ends thereof;

wherein the contacting portions are parallel to each other, the bending portions extend substantially perpendicularly from the corresponding contacting portions, and the connecting portion is non-parallel to the contacting portions and the bending portions.

5. The electronic device of claim 4, wherein the contacting portions and the connecting portion are continuous in a direction parallel to the contacting portions.

6. The electronic device of claim 4, wherein the contacting portions and the connecting portion overlap each other entirely in a direction parallel to the contacting portions.

7. The electronic device of claim 4, wherein the bending portions overlap partly in a direction perpendicular to the contacting portions, and the contacting portions and the connecting portion are continuous in a direction parallel to the contacting portions.

8. The electronic device of claim 4, wherein the other one of the contacting portions attaches to the shell for conducting heat of the electronic component to the shell.

9. A heat sink comprising at least one fin, the at least one fin comprising a connecting portion, two bending portions respectively extending from opposite sides of the connecting portion along opposite directions, and two contacting portions respectively extending from rear sides of the bending portions along opposite directions, all of the connecting portion, the bending portions and the contacting portions being flat;

wherein the bending portions are perpendicular to the contacting portions, and the connecting portion is aslant to the bending portions.

10. The heat sink of claim 9, further comprising a heat spreader firmly connected to one of the contacting portions.

11. The heat sink of claim 10, further comprising a second heat spreader firmly connected to the other one of the contacting portions.

12. The heat sink of claim 9, wherein the bending portions overlap partly in a direction perpendicular to the contacting portions.

13. The heat sink of claim 9, wherein the bending portions space from each other in a direction perpendicular to the contacting portions.

14. The heat sink of claim 13, wherein the connecting portion and the contacting portions are continuous in a direction parallel to the contacting portions.

15. The heat sink of claim 13, wherein the connecting portion and the contacting portions overlap entirely in a direction parallel to the contacting portions.

16. The heat sink of claim 12, wherein the connecting portion and the contacting portions overlap entirely in a direction parallel to the contacting portions.

17. The heat sink of claim 12, wherein the connecting portion and the contacting portions are continuous in a direction parallel to the contacting portions.

* * * * *